(12) United States Patent
Balakrishnan et al.

(10) Patent No.: US 9,953,884 B2
(45) Date of Patent: Apr. 24, 2018

(54) FIELD EFFECT TRANSISTOR INCLUDING STRAINED GERMANIUM FINS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/353,022

(22) Filed: Nov. 16, 2016

(65) Prior Publication Data

US 2017/0148680 A1    May 25, 2017

Related U.S. Application Data

(63) Continuation of application No. 14/948,737, filed on Nov. 23, 2015, now Pat. No. 9,570,443.

(51) Int. Cl.
*H01L 29/78* (2006.01)
*H01L 21/02* (2006.01)
*H01L 27/092* (2006.01)
*H01L 21/8258* (2006.01)
*H01L 21/8238* (2006.01)
*H01L 21/8252* (2006.01)

(52) U.S. Cl.
CPC ...... *H01L 21/8258* (2013.01); *H01L 21/0237* (2013.01); *H01L 21/02532* (2013.01); *H01L 21/02617* (2013.01); *H01L 27/0924* (2013.01); *H01L 29/7849* (2013.01); *H01L 21/02381* (2013.01); *H01L 21/02395* (2013.01); *H01L 21/8252* (2013.01); *H01L 21/823807* (2013.01); *H01L 21/823821* (2013.01)

(58) Field of Classification Search
CPC ....... H01L 21/823821; H01L 21/02381; H01L 21/02395; H01L 21/0245; H01L 21/823807; H01L 29/78; H01L 29/66795
See application file for complete search history.

(56) References Cited

U.S. PATENT DOCUMENTS 8,951,870 B2    2/2015  Basker et al.
2008/0099785 A1*  5/2008  Bai .................. C30B 25/183
                                          257/190

(Continued)

OTHER PUBLICATIONS van Dal, M.J.H. et al., Germanium p-Channel FinFET Fabricated by Aspect Ratio Trapping, IEEE Transactions on Electron Devices, vol. 61, Issue: 2, Feb. 2014, pp. 430-436, DOI: 10.1109/TED.2013.2295883.

(Continued)

*Primary Examiner* — Benjamin Sandvik
*Assistant Examiner* — Gustavo Ramallo
(74) *Attorney, Agent, or Firm* — Louis Percello

(57) ABSTRACT

In one example, a device includes a p-type field effect transistor region and n-type field effect transistor region. The p-type field effect transistor region includes at least one fin including strained germanium. The n-type field effect transistor region also includes at least one fin including strained germanium.

20 Claims, 15 Drawing Sheets

(56) References Cited

U.S. PATENT DOCUMENTS

| | | | |
|---|---|---|---|
| 2009/0065853 A1* | 3/2009 | Hanafi | H01L 29/1054 257/327 |
| 2010/0072515 A1 | 3/2010 | Park et al. | |
| 2014/0099774 A1 | 4/2014 | Vincent | |
| 2014/0151766 A1 | 6/2014 | Eneman et al. | |
| 2015/0024573 A1 | 1/2015 | Jacobs et al. | |
| 2015/0054033 A1 | 2/2015 | Cheng et al. | |
| 2015/0102386 A1 | 4/2015 | Chen et al. | |
| 2015/0270120 A1* | 9/2015 | Wang | H01L 21/0262 438/503 |
| 2017/0179124 A1* | 6/2017 | Kim | H01L 27/0886 |

OTHER PUBLICATIONS

Teugels, L. et al., "Improving defectivity for III-V CMP processes for <10 nm technology nodes" International Conference on Planarization/CMP Technology (ICPT), Nov. 19-21, 2014, pp. 15-17, DOI: 10.1109/ICPT.2014.7017234.

* cited by examiner

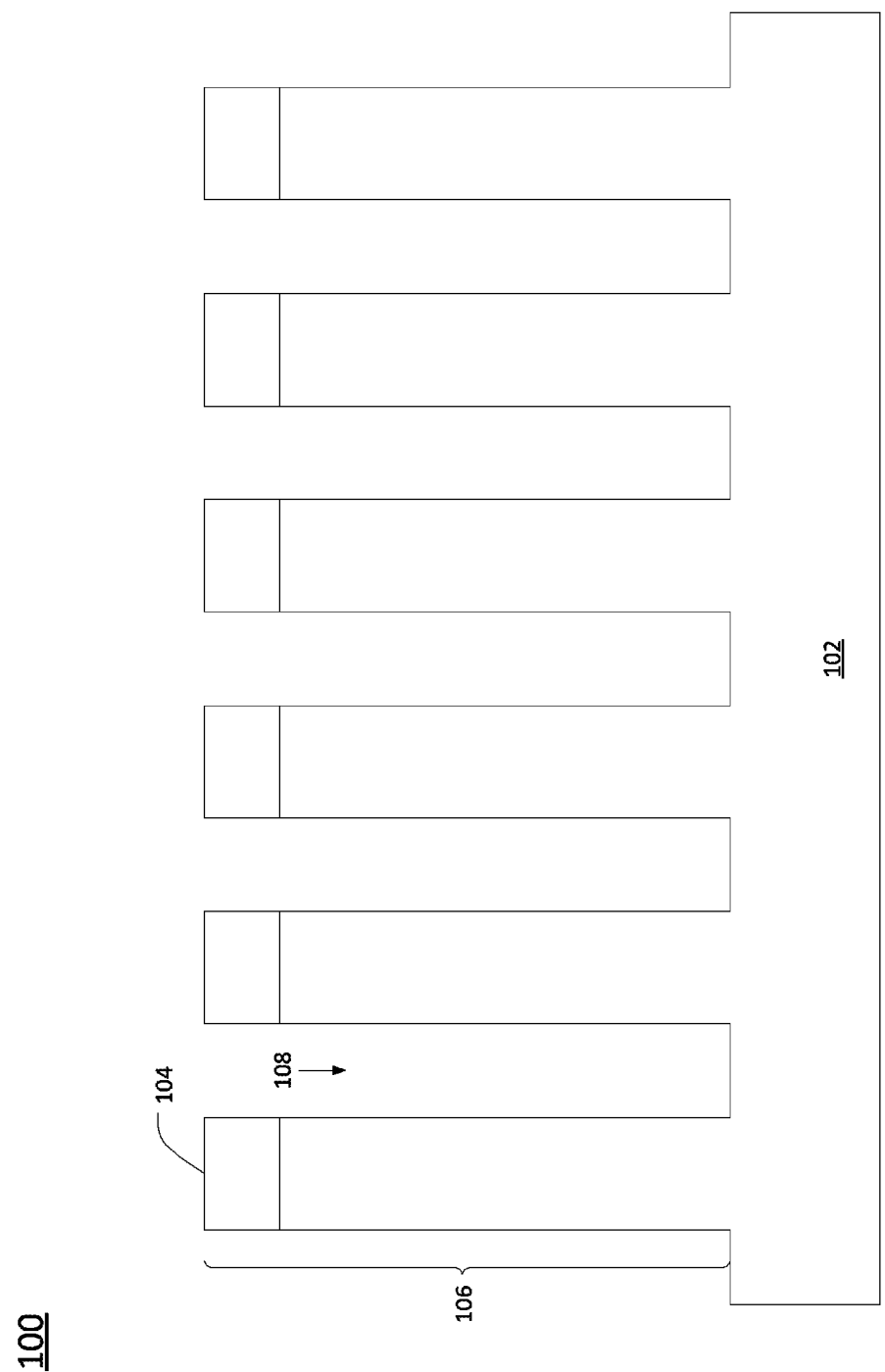

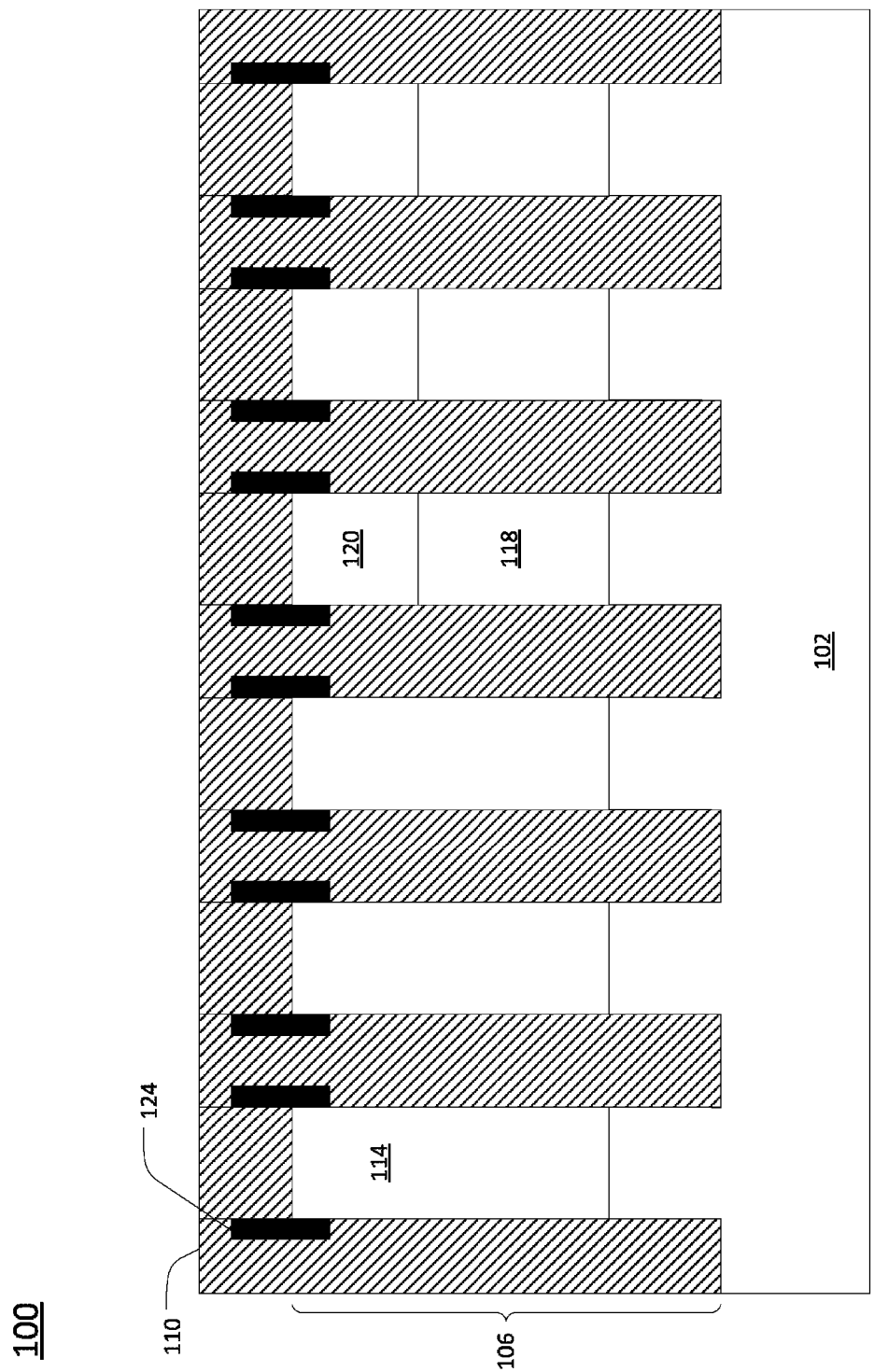

FIELD EFFECT TRANSISTOR INCLUDING STRAINED GERMANIUM FINS

FIELD OF THE DISCLOSURE

The present disclosure relates generally to semiconductor devices and relates more specifically to multiple gate field effect transistors.

BACKGROUND OF THE DISCLOSURE

Multiple gate field effect transistors (FETs) are metal-oxide-semiconductor field effect transistors (MOSFETs) that incorporate more than one gate into a single device. A finFET is a specific type of multiple gate FET in which the conducting channel is wrapped by a thin fin forming the body of the device. The effective channel length of the device in this case is determined by the thickness of the fin (measured from source to drain). The wrap-around structure of the gate provides improved electrical control over the channel, and thus helps mitigate leakage current and other short-channel effects.

SUMMARY OF THE DISCLOSURE

In one example, a device includes a p-type field effect transistor region and n-type field effect transistor region. The p-type field effect transistor region includes at least one fin including strained germanium. The n-type field effect transistor region also includes at least one fin including strained germanium. For example, the at least one fin of the p-type field effect transistor region may include compressive strained germanium, while the at least one fin of the n-type field effect transistor region may include tensile strained germanium.

In another example, a device includes a p-type field effect transistor region and n-type field effect transistor region. The p-type field effect transistor region includes a first mandrel including relaxed silicon germanium and a first fin grown on a sidewall of the mandrel. The first fin includes compressive strained germanium. The n-type field effect transistor region includes a second mandrel including at least one relaxed Group III-V semiconductor material and a second fin grown on a sidewall of the second mandrel. The second fin includes tensile strained germanium.

In another example, a method for fabricating a device includes forming a first mandrel in a p-type field effect transistor region of the device and forming a second mandrel in an n-type field effect transistor region of the device. A first compressive strained germanium fin is grown on a sidewall of the first mandrel, and a second tensile strained germanium fin is grown on a sidewall of the second mandrel.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

Figure 1B:
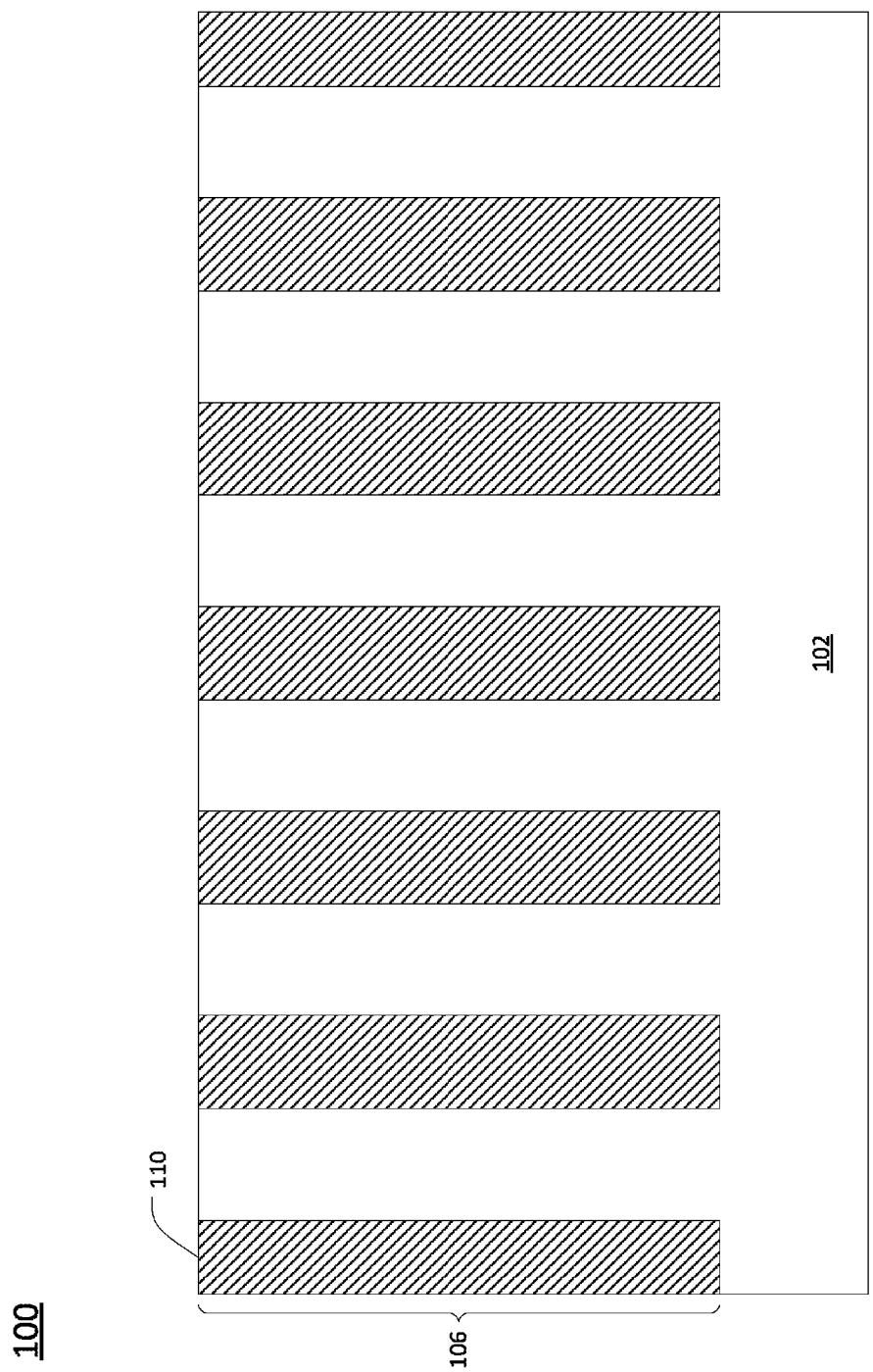
FIGS. 1A-1O illustrate cross sectional views of a field effect transistor during various stages of a fabrication process.

In one example, a field effect transistor including strained germanium fins is disclosed. When used in the fins of a p-type FET (pFET), germanium has been experimentally and theoretically shown to offer higher carrier (hole) mobility and improved capacity for inversion layer thickness ($T_{inv}$) scaling relative to conventional silicon. However, when used in the fins of an n-type FET (nFET), the improvements in carrier (electron) mobility and $T_{inv}$ scaling are less pronounced. Using Groups III-V semiconductor materials in the fins can improve carrier mobility in the nFET, but low density of states effective mass of these materials makes $T_{inv}$ scaling more difficult.

Examples of the present disclosure provide a finFET including strained germanium fins in both the pFET and nFET regions. In one particular example, the fins in the pFET region include compressive strained germanium, while the fins in the nFET region include tensile strained germanium. A fabrication process for the disclosed finFET includes growing the strained germanium on sidewalls of dummy mandrels, which may be formed from relaxed Groups III-IV semiconductor materials and/or relaxed silicon germanium (SiGe). Homo-integration of the pFET and nFET regions via this fabrication process allows the thermal budgets to match the first order. The strained germanium in the nFET region improves carrier mobility relative to silicon, while the $T_{inv}$ can be scaled to sub-one nanometer, resulting in better electrostatics and relaxing the need for fin width shrinkage for a given gate length.

FIGS. 1A-1O illustrate cross sectional views of a field effect transistor 100 during various stages of a fabrication process performed according to examples of the present disclosure. As such, when viewed in sequence, FIGS. 1A-O also serve as a flow diagram for the fabrication process.

Referring to FIG. 1A, the field effect transistor (FET) 100 begins as a substrate 102, formed, for example, from bulk silicon (Si) or silicon on insulator (SOI). A first hard mask layer 104, formed, for example, from a nitride, is deposited directly on the substrate 102. A plurality of deep trenches 108 are then formed in the structure, for example by etching. The remaining portions of the structure form a plurality of mandrels 106, such that each trench 108 is positioned between a pair of mandrels 106.

Referring to FIG. 1B, a shallow trench isolation (STI) layer 110, formed, for example, from an oxide, is deposited directly over the mandrels 106 and fills in the trenches 108 between the mandrels 106. The STI layer 110 is then planarized, for example via chemical mechanical planarization (CMP), and the first hard mask layer 104 is removed.

Figure 1C:
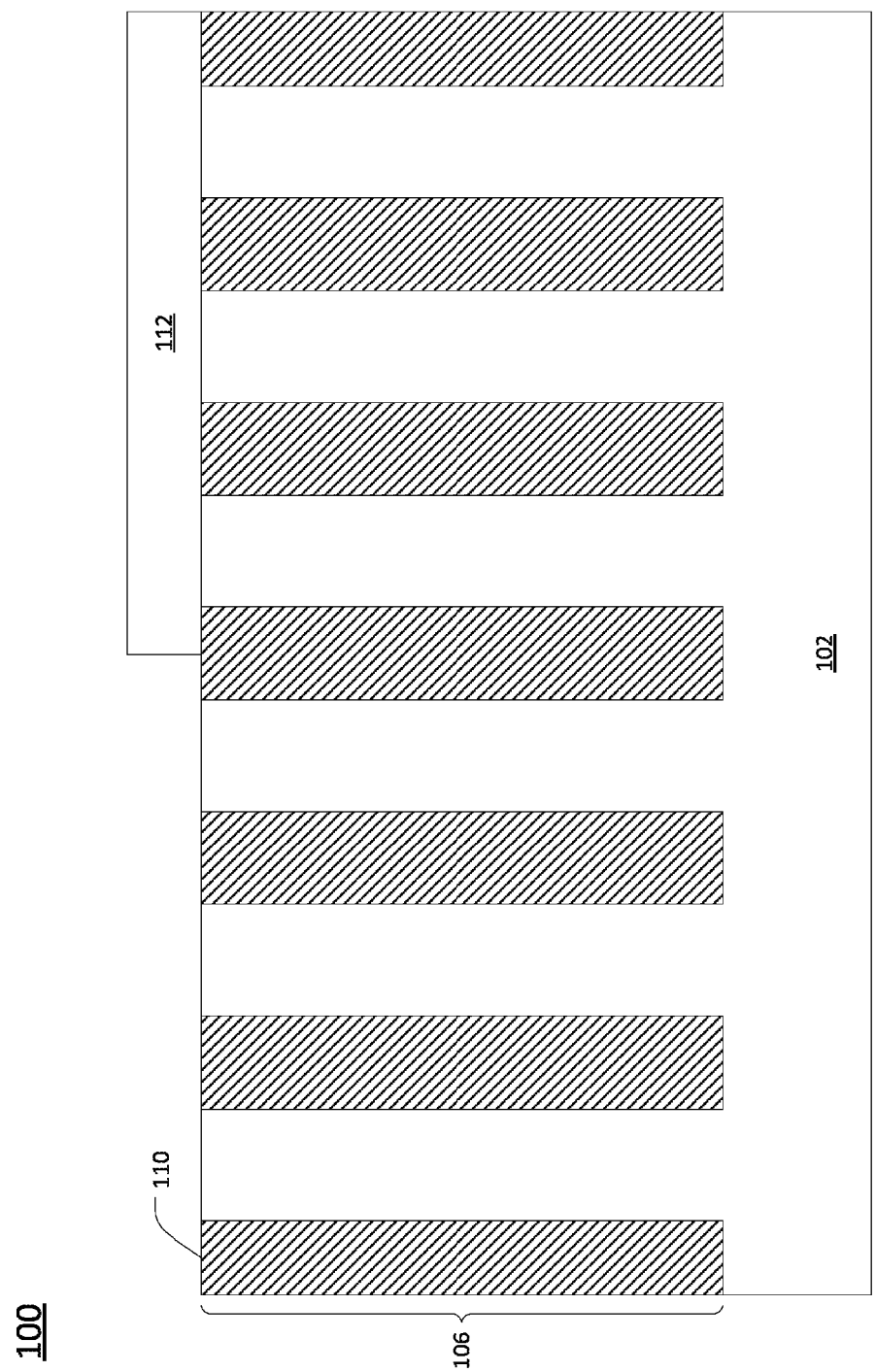

Referring to FIG. 1C, a second hard mask layer 112, formed, for example, from a nitride, is next deposited over some of the mandrels 106 and (filled) trenches 108. In one example, the second hard mask layer 112 is deposited over only the mandrels 106 and trenches 108 that reside in the nFET region of the FET 100 (e.g., the right-hand side of the FET 100 in FIG. 1C). This may result in the second hard mask layer 112 covering only part of one of the trenches 108 (e.g., as illustrated in FIG. 1D).

Figure 1D:
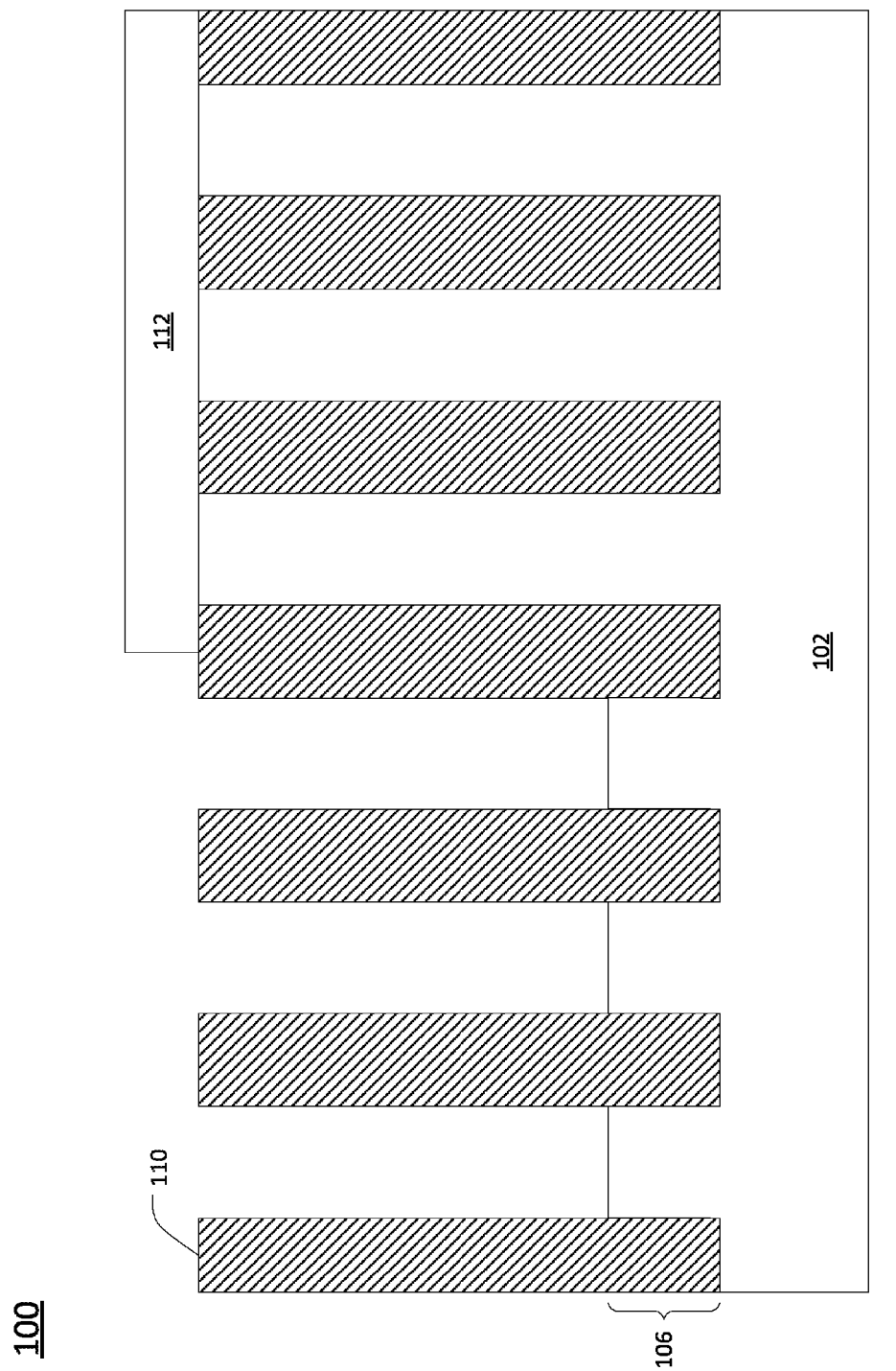

Referring to FIG. 1D, the mandrels 106 that are not positioned below the second hard mask layer 112 are next recessed. In one example, recessing removes a majority of the mandrels 106, but leaves a portion of the mandrel residing closer to the substrate 102. In one example, the mandrels that are recessed in FIG. 1D reside in the pFET region of the FET 100 (e.g., the left-hand side of the FET 100 in FIG. 1D).

Figure 1E:
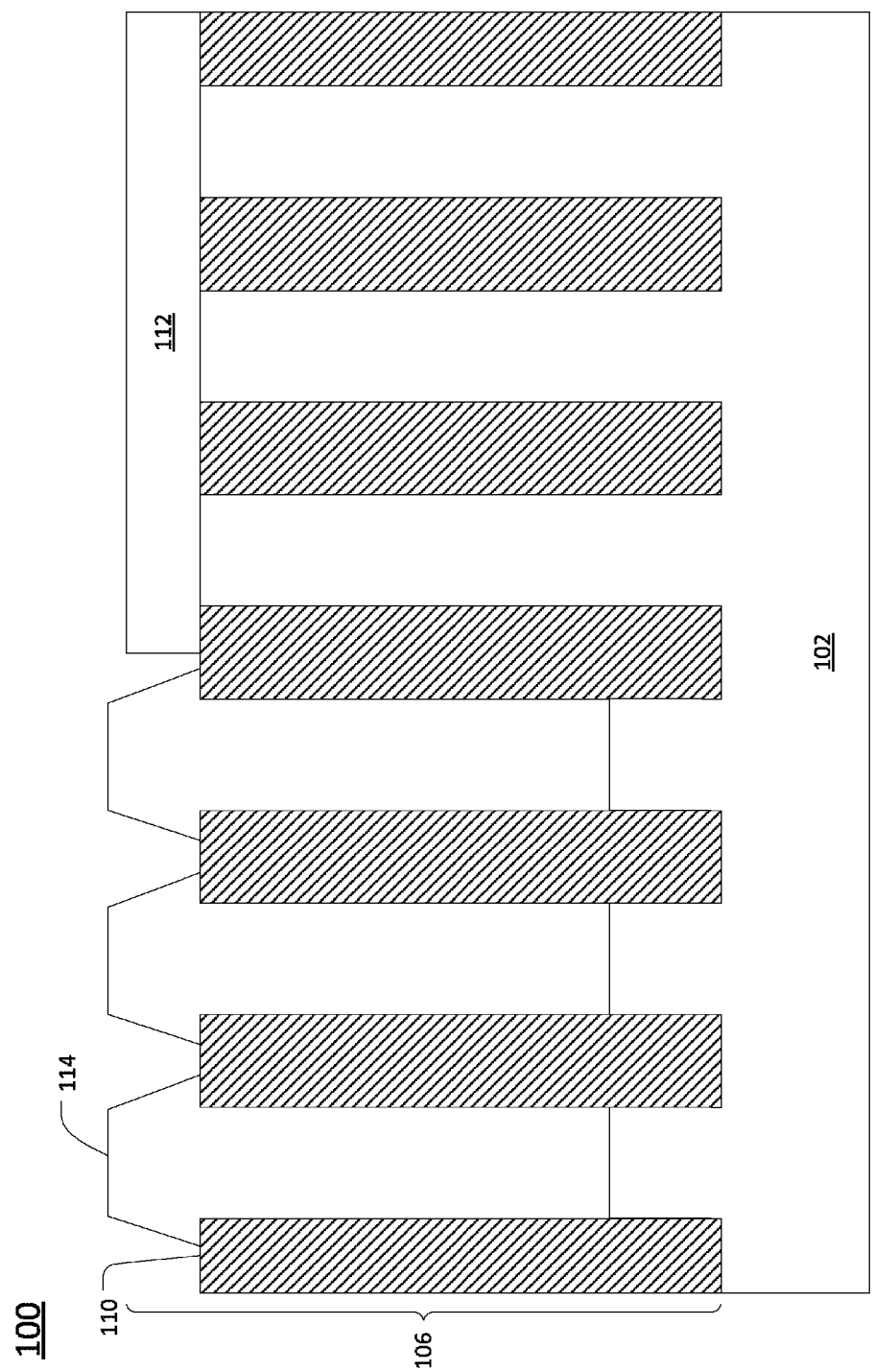

Referring to FIG. 1E, a first dummy layer 114 is next grown in the portions of the mandrels 106 that were recessed in FIG. 1D. In one embodiment, the first dummy layer 114 contains germanium. In one example, the first dummy layer 114 has a germanium concentration of between approximately forty and one hundred percent. For instance, the first dummy layer 114 may comprise silicon germanium. In a further example, the silicon germanium is strain relaxed silicon germanium. The first dummy layer 114 may be grown, for example, by aspect ratio trapping.

Figure 1F:
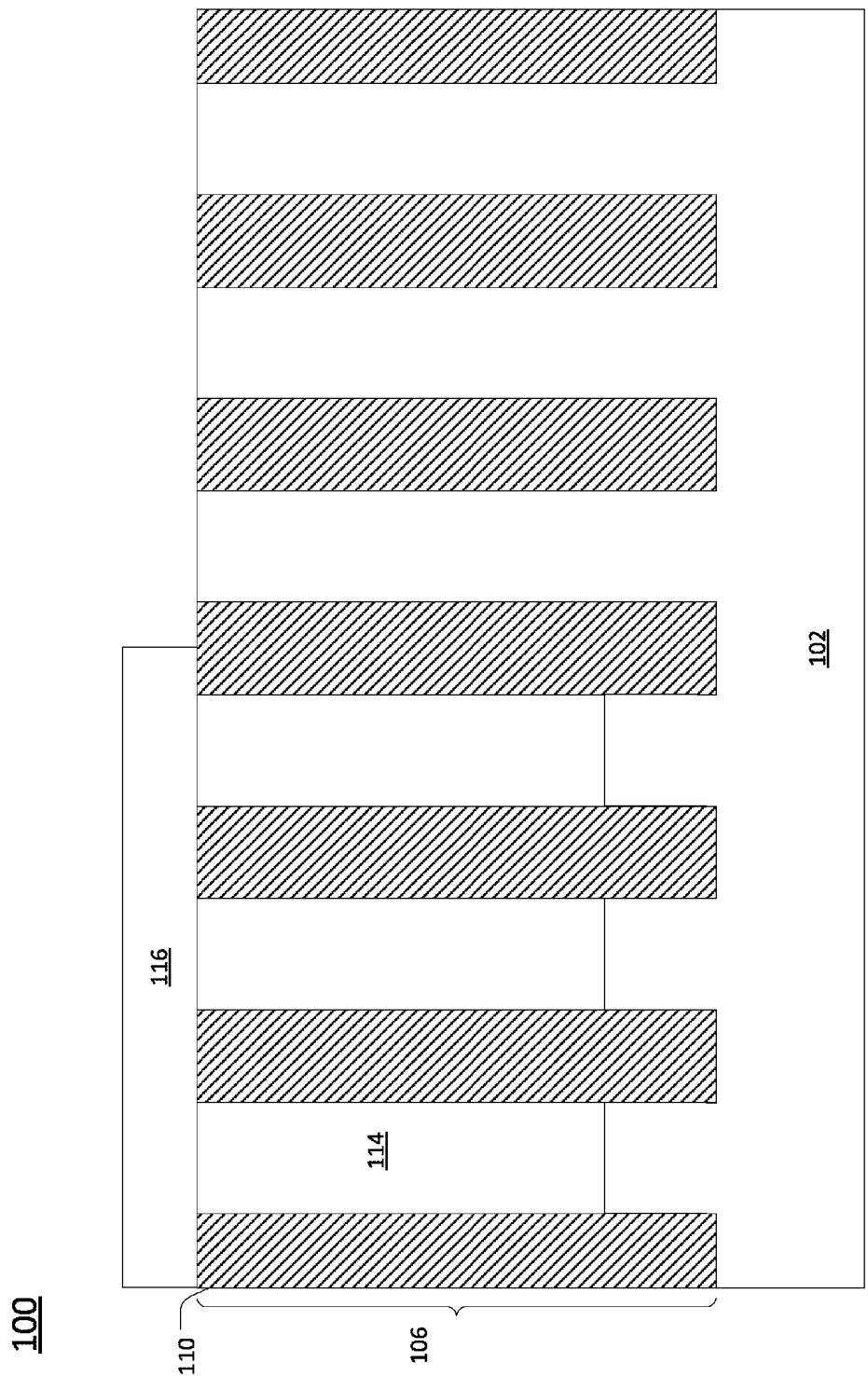

Referring to FIG. 1F, the first dummy layer 114 is next planarized, for example by CMP. The second hard mask layer 112 is also removed. A third hard mask layer 116, formed, for example, from a nitride, is next deposited over some of the mandrels 106 and (filled) trenches 108. In one example, the third hard mask layer 116 is deposited over only the mandrels 106 and trenches 108 that reside in the pFET region of the FET 100 (e.g., the left-hand side of the FET 100 in FIG. 1F), i.e., over the mandrels 106 in which the first dummy layer 114 was grown in FIG. 1E. This may result in the third hard mask layer 116 covering only part of one of the trenches 108 (e.g., as illustrated in FIG. 1F).

Figure 1G:
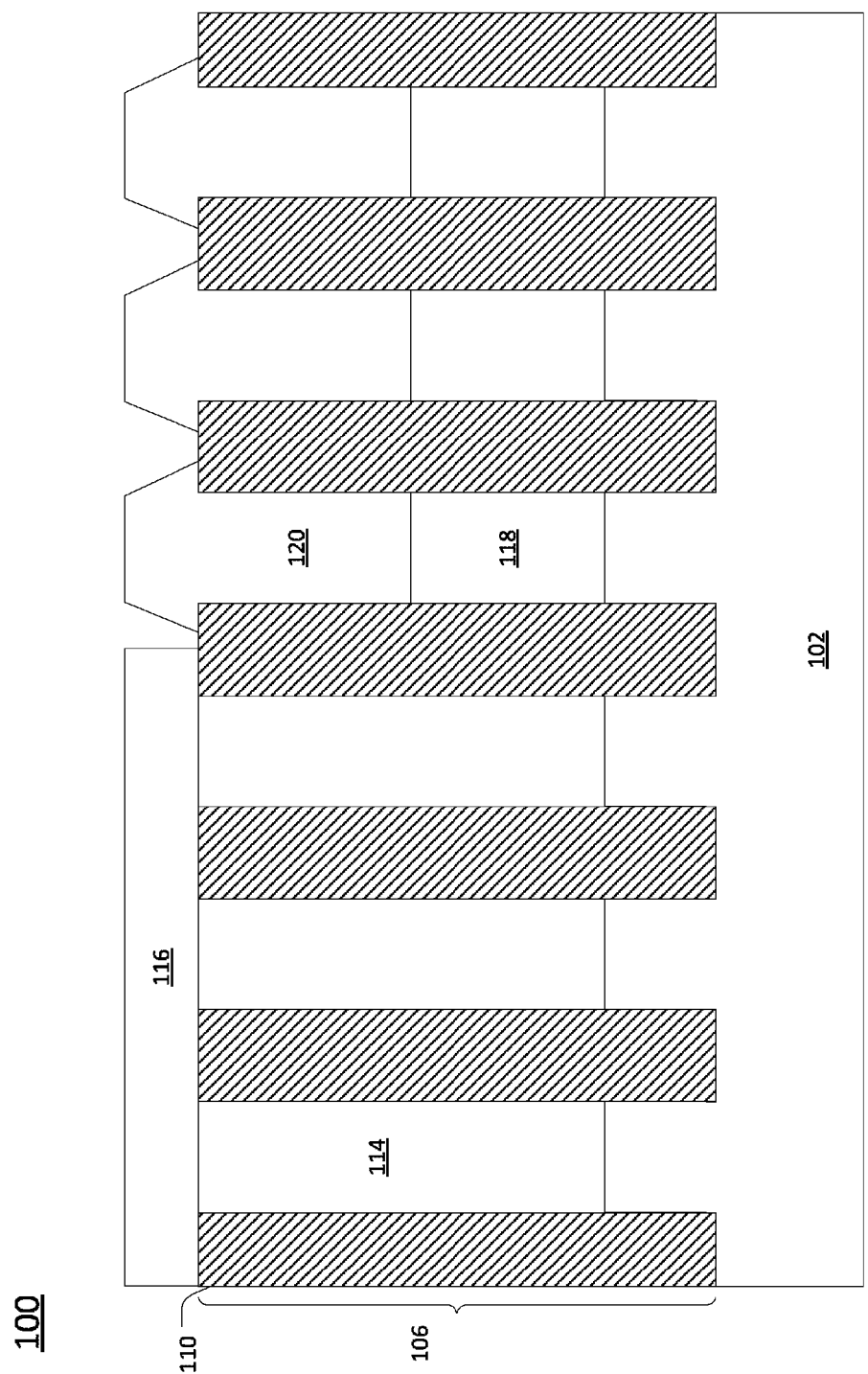

Referring to FIG. 1G, the mandrels 106 that are not positioned below the third hard mask layer 116 are next recessed. In one example, recessing removes a majority of the mandrels 106, but leaves a portion of the mandrel residing closer to the substrate 102. In one example, the mandrels 106 that are recessed in FIG. 1G reside in the nFET region of the FET 100 (e.g., the right-hand side of the FET 100 in FIG. 1G). A second dummy layer 118 followed by a third dummy layer 120 are next grown in the recessed portions of the mandrels 106. In one embodiment, the second dummy layer 118 and the third dummy layer 120 contain Groups III-V semiconductor materials. For instance, the second dummy layer 118 may comprise strain relaxed gallium arsenide (GaAs), while the third dummy layer 120 comprises strain relaxed indium gallium arsenide (e.g., $In_xGa_{1-x}As$). In one embodiment, the relative concentrations of indium, gallium, and arsenic are such that the lattice structure of the third dummy layer is approximately one to two percent larger than the lattice structure of the germanium in the first dummy layer 114. Either or both of the second dummy layer 118 and the third dummy layer 120 may be grown, for example, by aspect ratio trapping.

Figure 1H:
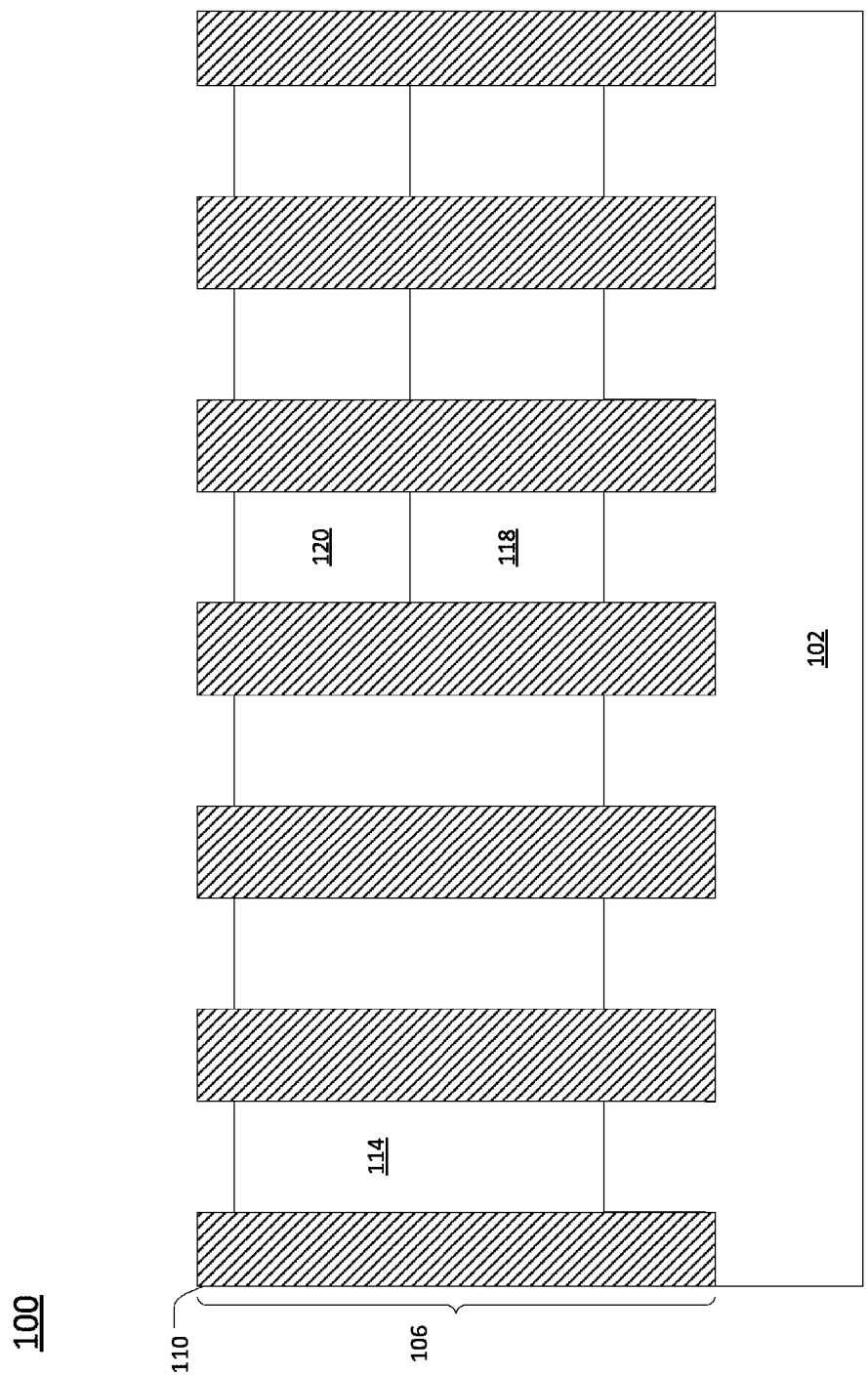

Referring to FIG. 1H, the third dummy layer 120 is next planarized, for example by CMP. The third hard mask layer 116 is also removed. All of the mandrels 106 are then recessed. In one example, recessing removes a portion of the mandrels 106 furthest from the substrate 102. In one example, the mandrels 106 in the nFET region and the pFET region are recessed in a single process. In another example, the mandrels 106 in the nFET region and the mandrels 106 in the pFET region are recessed in separate processes.

Figure 1I:
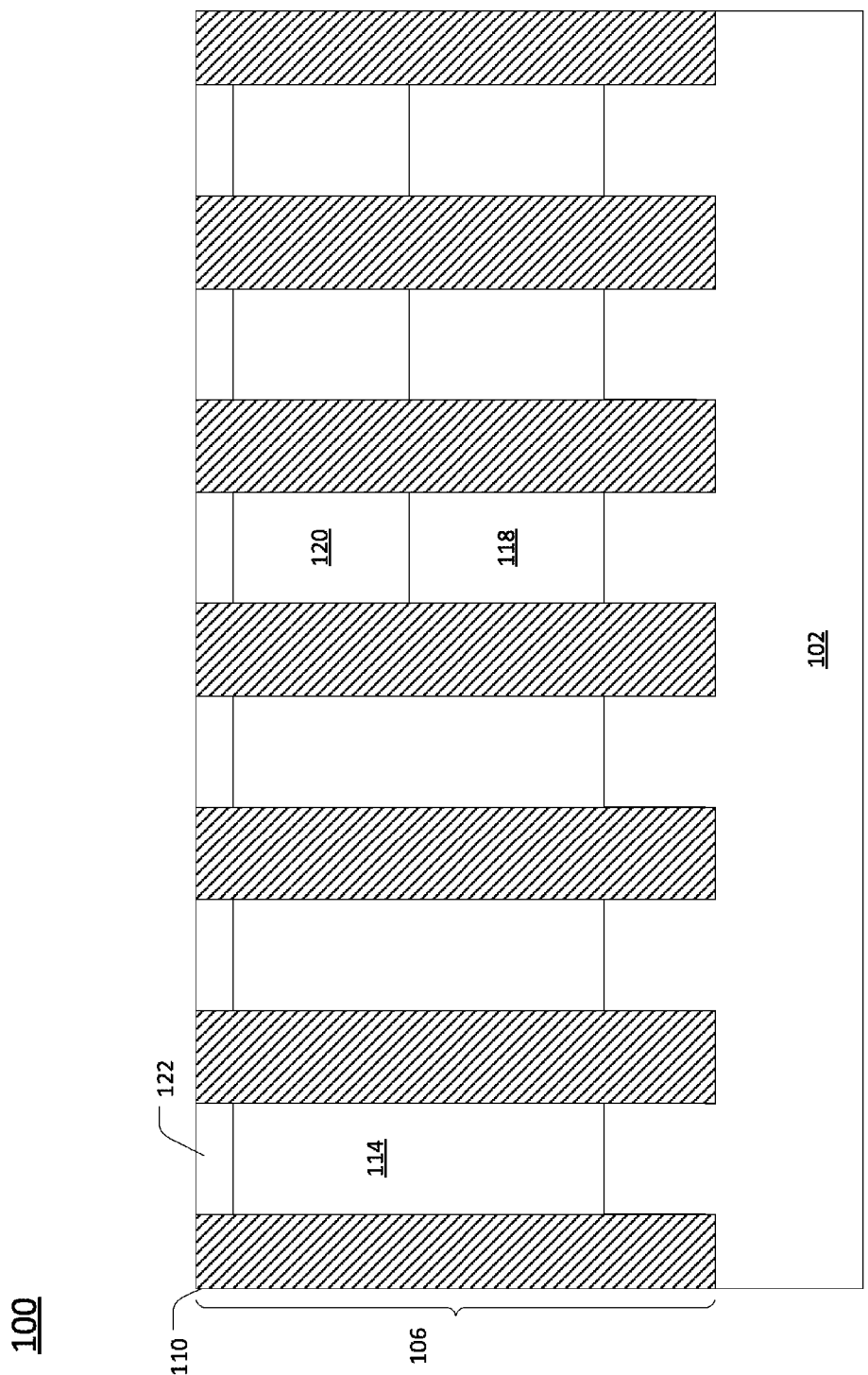

Referring to FIG. 1I, a fourth hard mask layer 122 is next deposited over the mandrels 106 and the STI layer 110. The fourth hard mask layer 122 is then planarized, for example by CMP.

Figure 1J:
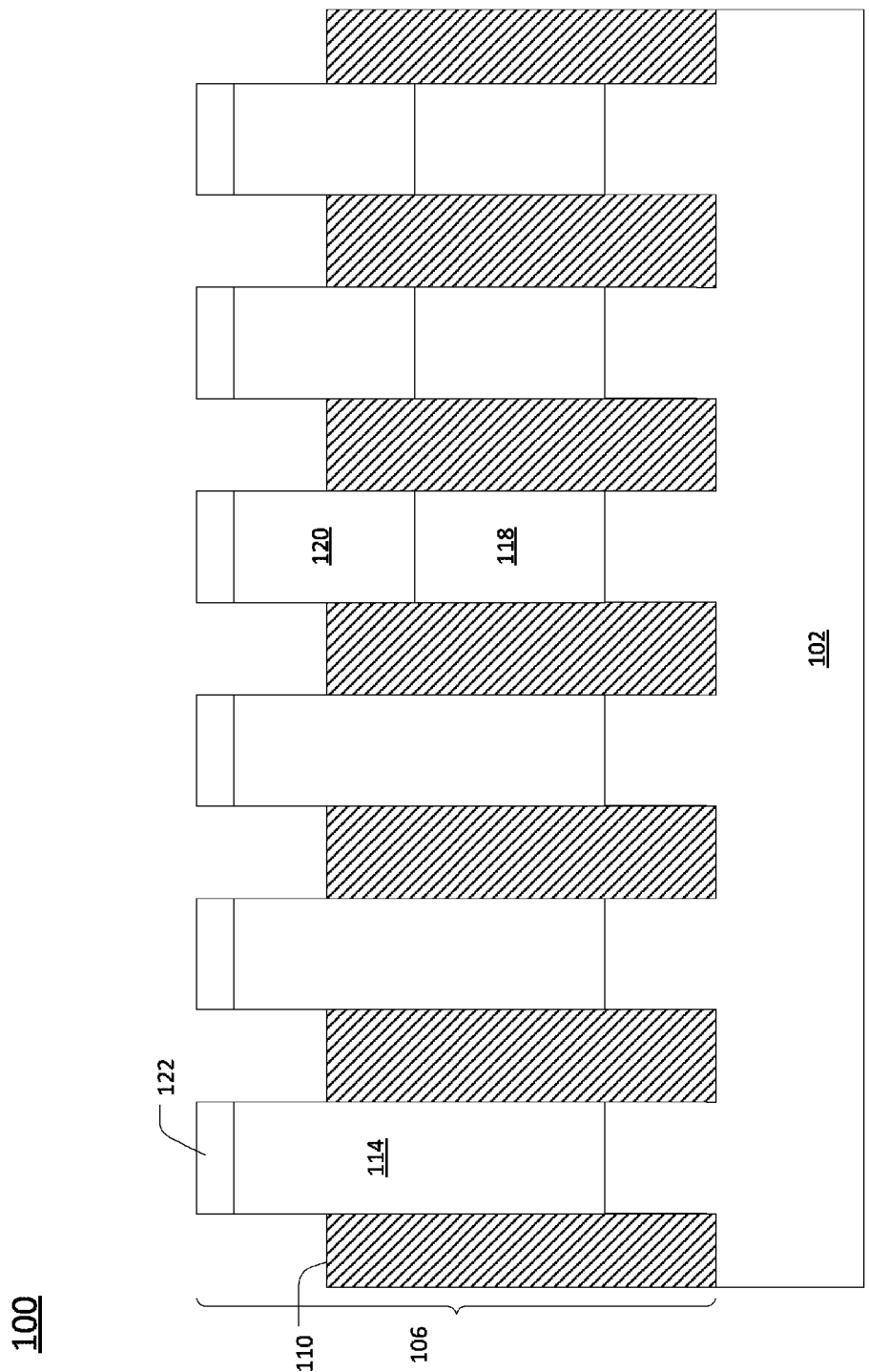

Referring to FIG. 1J, the STI layer 110 is next recessed. In one example, recessing removes a portion of the STI layer 110 furthest from the substrate 102, exposing portions of the sidewalls of the mandrels 106 that extend above the STI layer 110.

Figure 1K:
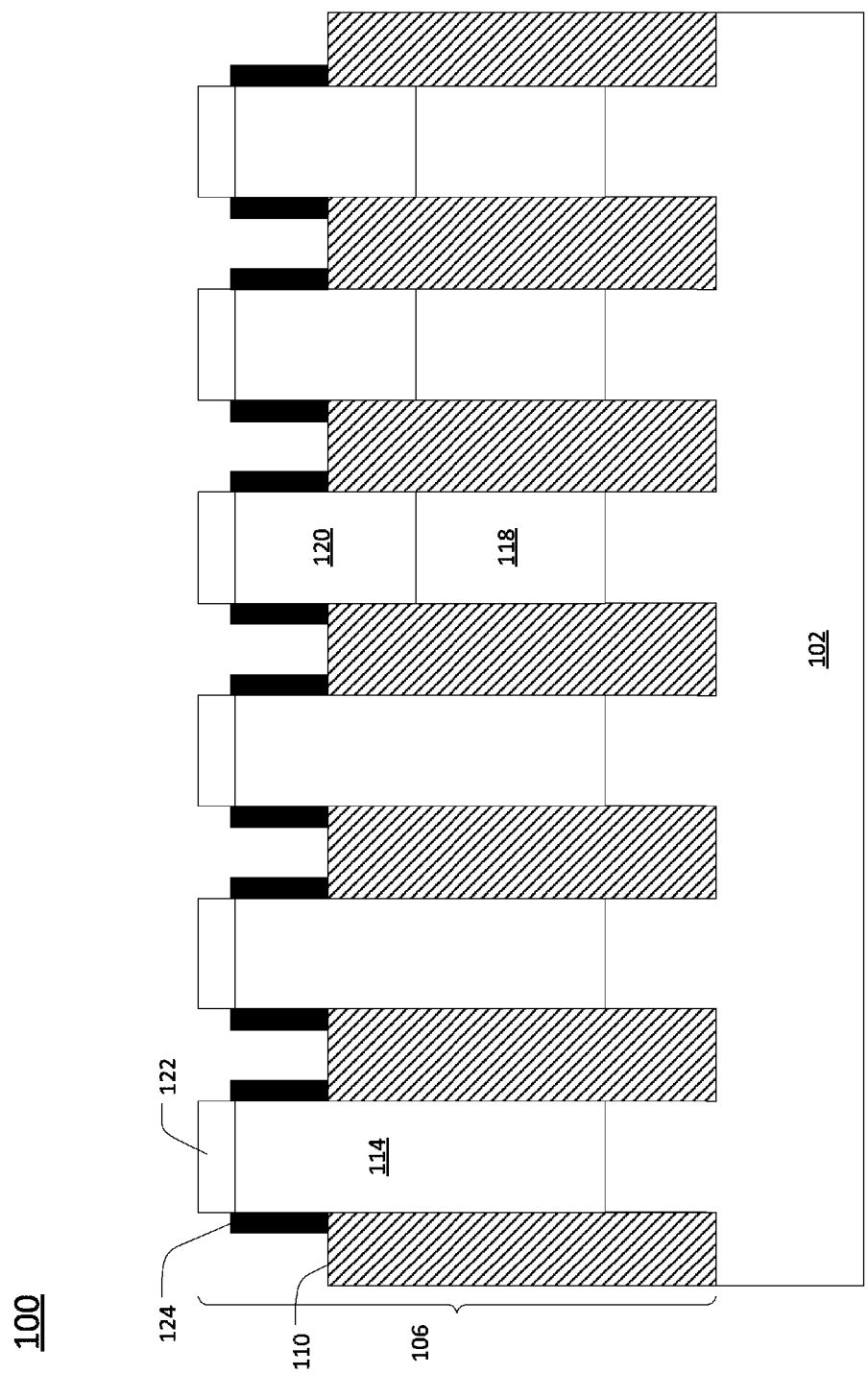

Referring to FIG. 1K, a germanium containing layer 124 is next grown on the exposed sidewalls of at least some of the mandrels 106. In one embodiment, the germanium that is grown on the sidewalls of the mandrels 106 in the pFET region is compressive strained, while the germanium that is grown on the sidewalls of the mandrels 106 in the nFET region is tensile strained.

Figure 1L:
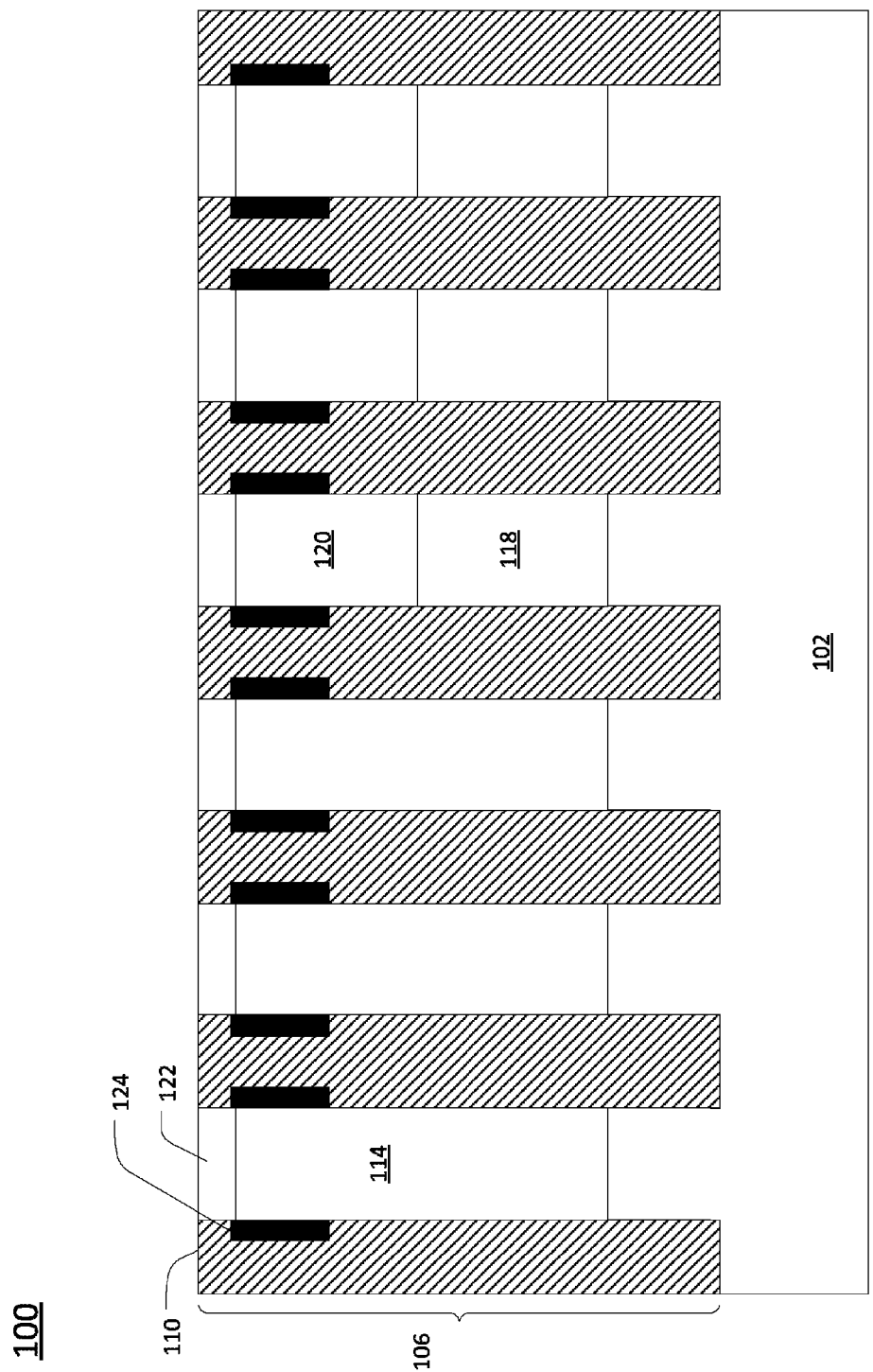

Referring to FIG. 1L, the STI layer 110 is next replenished, e.g., with additional oxide, so that the spaces between the mandrels 106 are filled. The STI layer 110 is then planarized, for example by CMP.

Figure 1M:
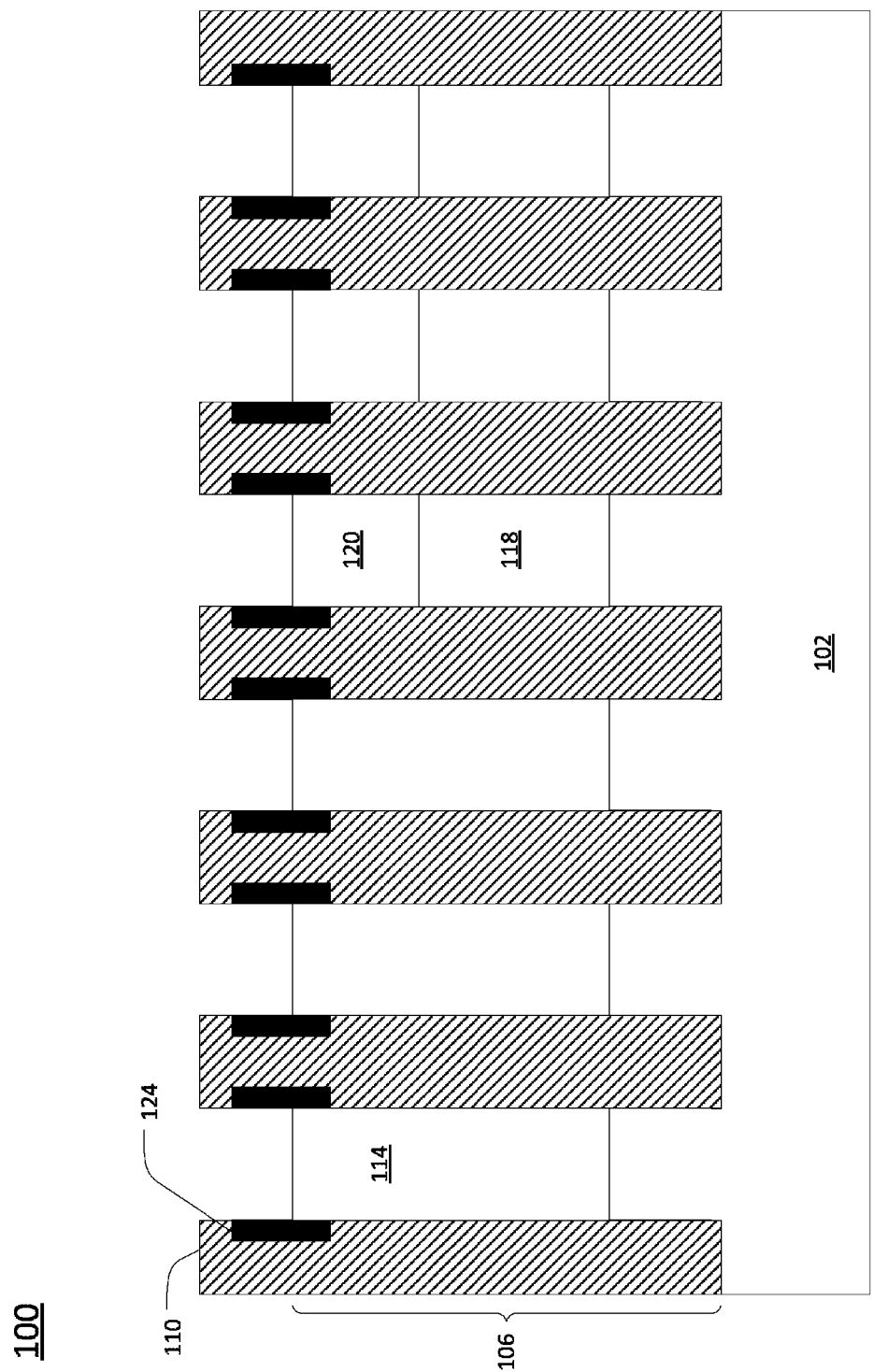
Figure 10:
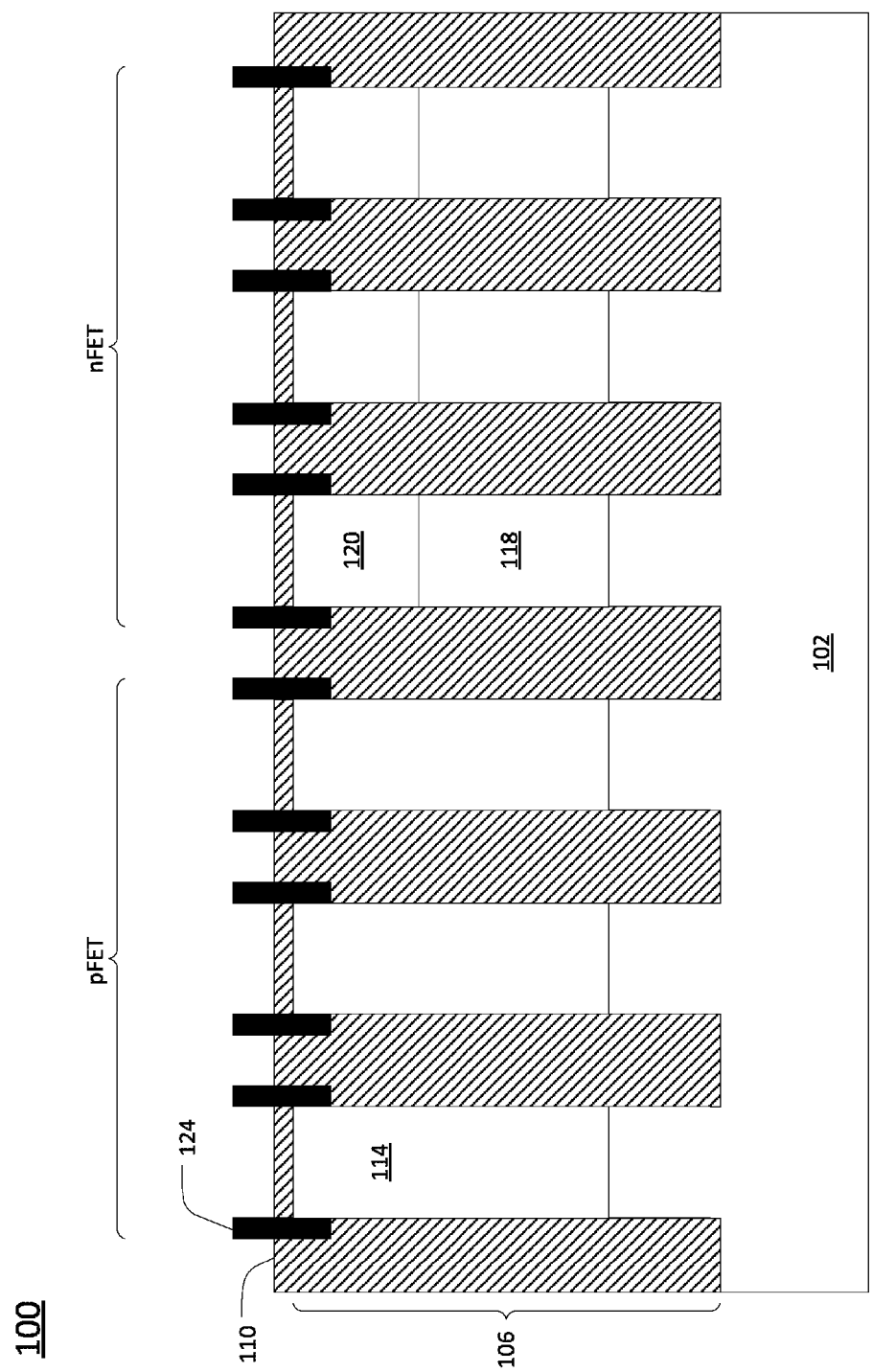

Referring to FIG. 1M, the fourth hard mask layer 122 is next removed. The mandrels 106 are then recessed selectively. In one embodiment, the mandrels 106 are recessed almost as deeply as the germanium containing layers 124, e.g., such that the recess stops above the foot of the germanium containing layers 124. In another embodiment, the mandrels 106 are recessed to the depth of the germanium containing layers 124 or deeper, e.g., such that the recess stops at or below the foot of the germanium containing layers 124. In one example, the mandrels 106 in the nFET region and the pFET region are recessed in a single process. In another example, the mandrels 106 in the nFET region and the mandrels 106 in the pFET region are recessed in separate processes.

Referring to FIG. 1N, the STI layer 110 is next replenished, e.g., with additional oxide, so that the portions of the mandrels 106 that were recessed in FIG. 1M are filled. In one embodiment, where the mandrels were recessed to the depth of the germanium containing layers 124 or deeper, punch-through stoppers are also formed for the nFET and pFET regions.

Referring to FIG. 1O, the STI layer 110 is next recessed, exposing portions of the germanium containing layers 124. The germanium containing layers 124 thus form fins of the FET 100. In the pFET region of the FET 100, the fins are formed of compressive strained germanium, while in the nFET region of the FET 100, the fins are formed of tensile strained germanium.

As can be seen in FIG. 1O, in one example, the buried ends of the fins in the resulting pFET region directly contact both the STI layer 110 and the first dummy layer 114. In particular, any given fin in the pFET region will have a bottom and one side that directly contact the STI layer 110, and another side that directly contacts both the STI layer 110 (i.e., the upper portion of the buried end) and the first dummy layer 114 (i.e., the lower portion of the buried end). Similarly, the buried ends of the fins in the resulting nFET region directly contact both the STI layer 110 and the third dummy layer 120. In particular, any given fin in the nFET region will have a bottom and one side that directly contact the STI layer 110, and another side that directly contacts both the STI layer 110 (i.e., the upper portion of the buried end) and the third dummy layer 120 (i.e., the lower portion of the buried end).

In a different example (e.g., where the mandrels were recessed to the depth of the germanium containing layers 124 or deeper in FIG. 1M, and punch-through stoppers were also formed for the nFET and pFET regions in FIG. 1N), the buried ends of the fins in the pFEt and nFET regions directly contact only the STI layer 110. In the pFET region, a portion of the first dummy layer 114 extends between and under each pair of fins, but does not directly contact any of the fins (as the STI layer 110 resides between the fins and the first dummy layer 114). Similarly, in the nFET region, a portion of the third dummy layer 120 extends between and under each pair of fins, but does not directly contact any of the fins (as the STI layer 110 resides between the fins and the third dummy layer 120)

Front end of line (FEOL) high-k metal gate (HK/MG) integration can proceed from the point illustrated in FIG. 1O as appropriate. Homo-integration of the pFET and nFET regions via the above-described fabrication process allows the thermal budgets to match the first order. The strained germanium in the nFET region improves carrier mobility relative to silicon, while the $T_{inv}$ can be scaled to sub-one nanometer, resulting in better electrostatics and relaxing the need for fin width shrinkage for a given gate length.

Although various embodiments which incorporate the teachings of the present invention have been shown and described in detail herein, those skilled in the art can readily devise many other varied embodiments that still incorporate these teachings.

What is claimed is:

1. A device comprising:
a p-type field effect transistor region including a first fin comprising compressive strained germanium grown on a first mandrel, wherein the first mandrel is recessed to a depth below a first end of the first fin; and
an n-type field effect transistor region including a second fin comprising tensile strained germanium grown on a second mandrel, wherein the second mandrel is recessed to a depth below a first end of the second fin.

2. The device of claim 1, wherein the first mandrel comprises silicon germanium.

3. The device of claim 2, wherein the silicon germanium is strain relaxed silicon germanium.

4. The device of claim 3, wherein a second end of the first fin is buried in a shallow trench isolation layer of the device, such that a bottom and a first side of the second end of the first fin directly contact the shallow trench isolation layer.

5. The device of claim 4, wherein a second side of the second end of the first fin includes a lower portion that directly contacts the relaxed silicon germanium and an upper portion that directly contacts the shallow trench isolation layer.

6. The device of claim 1, wherein the second mandrel comprises a Group III-V semiconductor material.

7. The device of claim 6, wherein the Group III-V semiconductor material is a strain relaxed Group III-V semiconductor material.

8. The device of claim 7, wherein a second end of the second fin is buried in a shallow trench isolation layer of the device, such that a bottom and a first side of the second end directly contact the shallow trench isolation layer.

9. The device of claim 8, wherein a second side of the second end of the second fin includes a lower portion that directly contacts the strain relaxed Group III-V semiconductor material and an upper portion that directly contacts the shallow trench isolation layer.

10. The device of claim 6, wherein the Group III-V semiconductor material comprises:
a layer of gallium arsenide; and
a layer of indium gallium arsenide deposited over the layer of gallium arsenide.

11. A device comprising:
a p-type field effect transistor region, comprising:
a first mandrel comprising relaxed silicon germanium; and
a first fin grown on a sidewall of the first mandrel and comprising compressive strained germanium, wherein the first mandrel is recessed to a depth below a first end of the first fin; and
an n-type field effect transistor region, comprising:
a second mandrel comprising at least one relaxed Group III-V semiconductor material; and
a second fin grown on a sidewall of the second mandrel and comprising tensile strained germanium, wherein the second mandrel is recessed to a depth below a first end of the second fin.

12. The device of claim 11, wherein the first fin comprises:
a second end that is buried in a shallow trench isolation layer of the device, such that a bottom and a first side of the second end directly contact the shallow trench isolation layer, and a second side of the second end includes a lower portion that directly contacts the relaxed silicon germanium and an upper portion that directly contacts the shallow trench isolation layer.

13. The device of claim 11, wherein the second fin comprises:
a second end that is buried in a shallow trench isolation layer of the device, such that a bottom and a first side of the second end directly contact the shallow trench isolation layer, and a second side of the second end includes a lower portion that directly contacts the relaxed Group III-V semiconductor material and an upper portion that directly contacts the shallow trench isolation layer.

14. A method for fabricating a device, the method comprising:
forming a first mandrel in a p-type field effect transistor region of the device;
forming a second mandrel in an n-type field effect transistor region of the device;
growing a compressive strained germanium fin on a sidewall of the first mandrel;
recessing the first mandrel to a depth below a first end of the compressive strained germanium fin;
growing a tensile strained germanium fin on a sidewall of the second mandrel; and
recessing the second mandrel to a depth below a first end of the tensile strained germanium fin.

15. The method of claim 14, wherein the first mandrel and the second mandrel are formed using aspect ratio trapping.

16. The method of claim 14, wherein the first mandrel comprises silicon germanium.

17. The method of claim 16, wherein the silicon germanium is strain relaxed silicon germanium.

18. The method of claim 14, wherein the second mandrel comprises at least one Group III-V semiconductor material.

19. The method of claim 18, wherein the at least one Group III-V semiconductor material is a strain relaxed Group III-V semiconductor material.

20. The method of claim 19, wherein the at least one Group III-V semiconductor material comprises:
a layer of gallium arsenide; and
a layer of indium gallium arsenide deposited over the layer of gallium arsenide.

* * * * *